(12) United States Patent
Kim et al.

(10) Patent No.: US 11,475,698 B2
(45) Date of Patent: *Oct. 18, 2022

(54) DISPLAY DEVICE

(71) Applicant: Samsung Display Co., Ltd., Yongin-si (KR)

(72) Inventors: Jeung Soo Kim, Yongin-si (KR); Tae Eun Kim, Yongin-si (KR); Youn Bum Lee, Yongin-si (KR); Young Kwang Kim, Yongin-si (KR); Tae Hun Kim, Yongin-si (KR); Sang Hyun Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 43 days.

This patent is subject to a terminal disclaimer.

(21) Appl. No.: 17/099,527

(22) Filed: Nov. 16, 2020

(65) Prior Publication Data

US 2021/0089742 A1   Mar. 25, 2021

Related U.S. Application Data

(63) Continuation of application No. 16/047,007, filed on Jul. 27, 2018, now Pat. No. 10,839,191.

(30) Foreign Application Priority Data

Dec. 21, 2017   (KR) .................. 10-2017-0176997

(51) Int. Cl.
    *G06V 40/13*    (2022.01)
    *H01L 27/32*    (2006.01)
    *H01L 27/146*   (2006.01)

(52) U.S. Cl.
    CPC ...... *G06V 40/1318* (2022.01); *H01L 27/3234* (2013.01); *H01L 27/3244* (2013.01); *H01L 27/14678* (2013.01)

(58) Field of Classification Search
    CPC .............. G06K 9/0004; H01L 27/3234; H01L 27/3244
    See application file for complete search history.

(56) References Cited

U.S. PATENT DOCUMENTS 10,929,635 B2    2/2021  Kwon et al.
2017/0270342 A1*  9/2017  He .................... G06V 40/1318
(Continued)

FOREIGN PATENT DOCUMENTS

KR    10-2017-0045075    4/2017
KR    10-2019-0026476    3/2019

OTHER PUBLICATIONS

Non-Final Office Action dated Feb. 4, 2020 issued to U.S. Appl. No. 16/047,007.

(Continued)

*Primary Examiner* — Utpal D Shah
(74) *Attorney, Agent, or Firm* — H.C. Park & Associates, PLC

(57) ABSTRACT

A display device including a substrate including a display region and a non-display region disposed at one side of the display region, the display region includes first and second areas adjacent to each other; a display unit disposed on a front surface of the substrate, the display unit including a plurality of pixels for displaying an image; a cushion layer disposed on a rear surface of the substrate, the cushion layer including a first opening portion corresponding to the first area; a fingerprint sensor provided in the first opening portion of the cushion layer, the fingerprint sensor sensing a fingerprint of a user; and a first light-blocking layer disposed on a rear surface of the substrate, the first light-blocking layer covering at least part of the cushion layer and a lower surface of the fingerprint sensor.

9 Claims, 7 Drawing Sheets

(56) References Cited

U.S. PATENT DOCUMENTS

| | | | |
|---|---|---|---|
| 2017/0316248 A1* | 11/2017 | He | G06V 40/13 |
| 2017/0336970 A1* | 11/2017 | Kim | G06F 3/04883 |
| 2018/0373913 A1* | 12/2018 | Panchawagh | G01S 7/52079 |
| 2019/0087630 A1* | 3/2019 | Seo | G06V 40/40 |
| 2019/0205596 A1* | 7/2019 | Kim | H01L 51/5281 |
| 2019/0205603 A1* | 7/2019 | Lee | H01L 51/5284 |

OTHER PUBLICATIONS

Notice of Allowance dated Jul. 1, 2020 issued to U.S. Appl. No. 16/047,007.

* cited by examiner

DISPLAY DEVICE

CROSS REFERENCE TO RELATED APPLICATION

This application is a Continuation of U.S. patent application Ser. No. 16/047,007, filed on Jul. 27, 2018, which claims priority from and the benefit of Korean Patent Application No. 10-2017-0176997, filed on Dec. 21, 2017, which is hereby incorporated by reference for all purposes as if fully set forth herein.

BACKGROUND

Field

Exemplary embodiments of the invention relate generally to a display device.

Discussion of the Background

A display device may be made lighter and thinner and is widely used. Among display devices, an organic light emitting display device is a self-luminescent device using an organic light emitting diode emitting light. That is, the organic light emitting display device may include no separate light source. Since the organic light emitting display device has low power consumption, excellent contrast, and fast response time, and high brightness, it is attracting attention as the next generation display devices.

The organic light emitting display device may include the organic light emitting diode and a plurality of pixels. Each of the pixels may include a plurality of transistors and at least one capacitor.

In addition, recently, for security reasons and the like, a display device including a fingerprint sensor has been developed. Accordingly, there is a demand for a display device that provides excellent display quality while improving the sensing ability of the fingerprint sensor.

The above information disclosed in this Background section is only for understanding of the background of the inventive concepts, and, therefore, it may contain information that does not constitute prior art.

SUMMARY

Exemplary embodiments provide a display device including a fingerprint sensor capable of improving sensing ability.

According to an exemplary embodiment, a display device including: a substrate including a display region and a non-display region disposed at one side of the display region, the display region includes first and second areas adjacent to each other; a display unit disposed on a front surface of the substrate, the display unit including a plurality of pixels configured to display an image; a cushion layer disposed on a rear surface of the substrate, the cushion layer including a first opening portion defined to be corresponding to the first area; a fingerprint sensor provided in the first opening portion of the cushion layer, the fingerprint sensor is configured to sense a fingerprint of a user; and a first light-blocking layer disposed on a rear surface of the substrate, the first light-blocking layer covering at least part of the cushion layer and a lower surface of the fingerprint sensor.

The display device may further comprise a protecting layer disposed between the substrate and the cushion layer.

The protecting layer may include a second opening portion defined to expose at least part of an upper surface of the fingerprint sensor.

The second opening portion of the protecting layer may be provided in the first area of the substrate and corresponds to the first opening portion of the cushion layer.

The protecting layer may include a mesh structure.

The protecting layer may include: a plurality of first insulating fine lines extending along a first direction; a plurality of second insulating fine lines extending along a second direction crossing the first direction; and a plurality of empty spaces provided at intersections of the plurality of first insulating fine lines and the plurality of second insulating fine lines.

The display device may further include an adhesive layer disposed between the fingerprint sensor and the protective layer.

The adhesive layer may be disposed on at least part of the upper surface of the fingerprint sensor.

The adhesive layer may be disposed on and cover the upper surface of the fingerprint sensor entirely.

The adhesive layer may include an optically clear adhesive material.

The display device may further include an auxiliary adhesive layer disposed between the cushion layer and the fingerprint sensor.

The display device may further include a flexible printed circuit board disposed on the cushion layer at the rear surface of the substrate.

The first light-blocking layer may be configured to fix the fingerprint sensor to the flexible printed circuit board and to block light incident on the fingerprint sensor from leaking to a rear surface of the flexible printed circuit board.

The display device may further include a second light-blocking layer disposed between the protecting layer and the cushion layer and corresponding to the second area.

The fingerprint sensor may include a plurality of fingerprint sensors provided in the first area.

The fingerprint sensor may be disposed on a surface of the substrate on which the display unit is not provided.

Each of the plurality of pixels may include at least one transistor disposed on the substrate and a light emitting element electrically connected to the transistors.

A light transmittance of the first area may be higher than a light transmittance of the second area.

The fingerprint sensor may include a photo sensor.

The fingerprint sensor may be configured to sense the light emitted from the display unit and reflected by the fingerprint of the user.

Additional features of the inventive concepts will be set forth in the description which follows, and in part will be apparent from the description, or may be learned by practice of the inventive concepts.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

Exemplary embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

Figure 1:
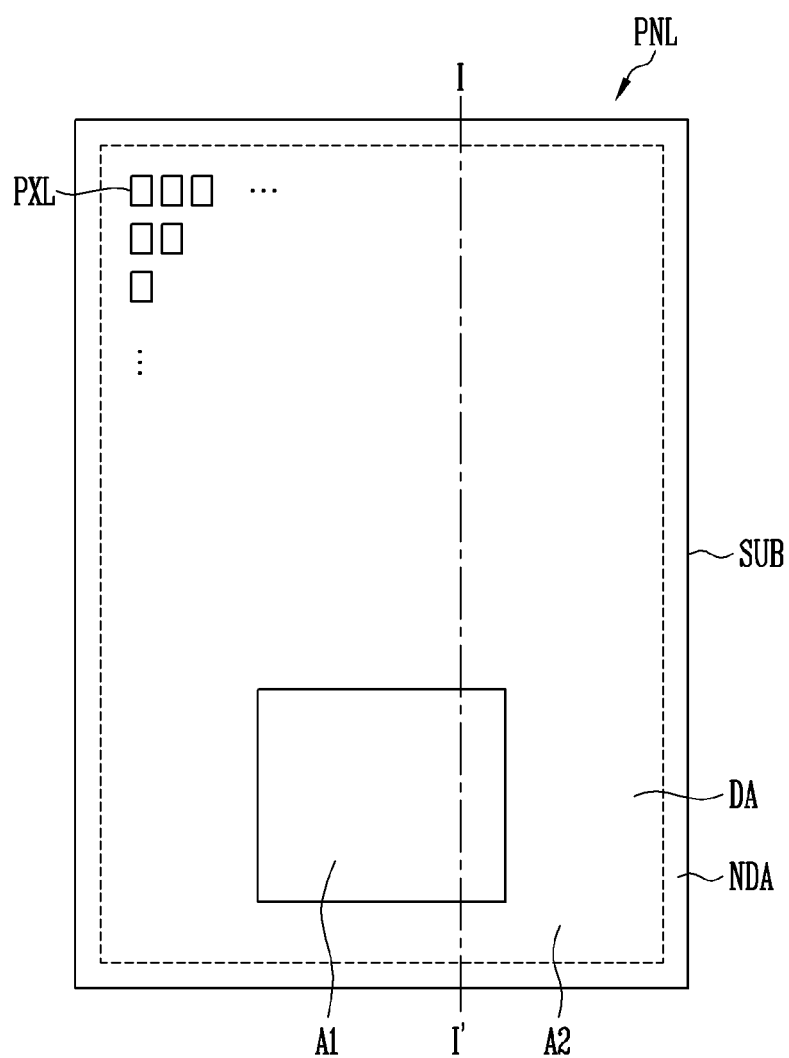

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIG. 1 is a plan view illustrating a display device according to an exemplary embodiment of the present disclosure.

Figure 2A:
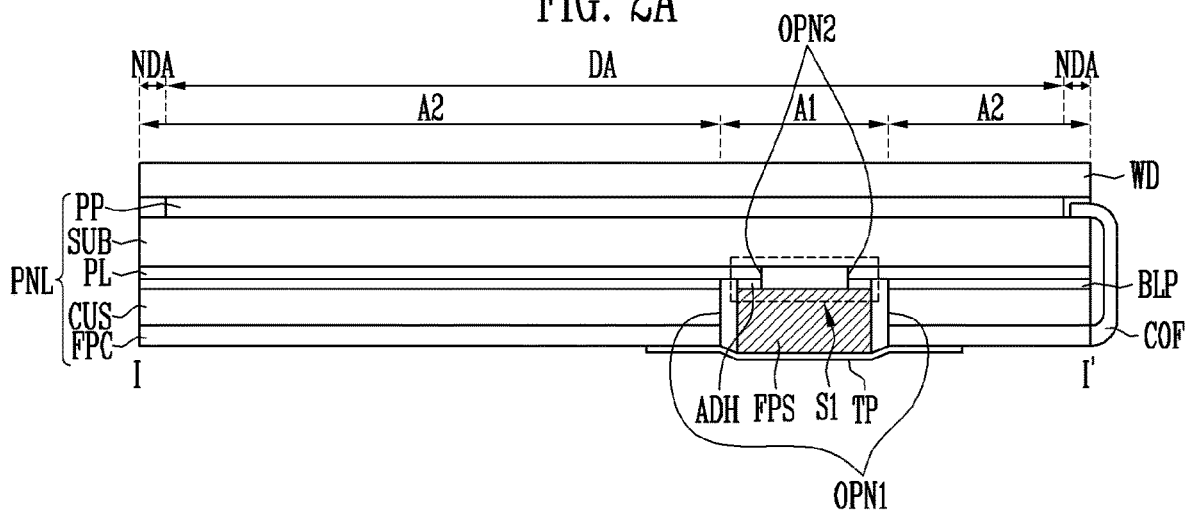

FIG. 2A is a cross-sectional view taken along line I-I' of FIG. 1.

Figure 2B:
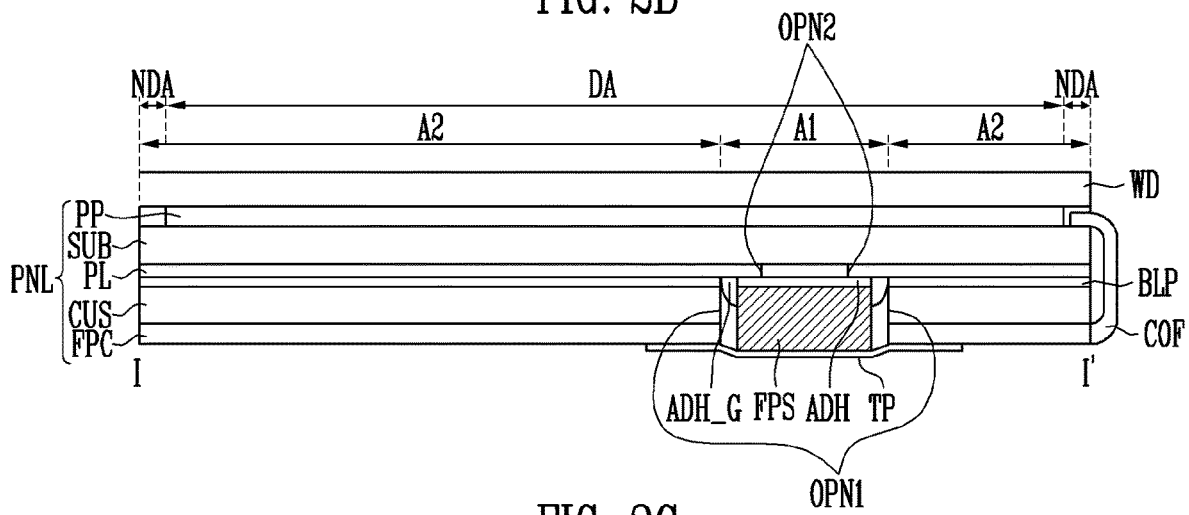
Figure 2C:
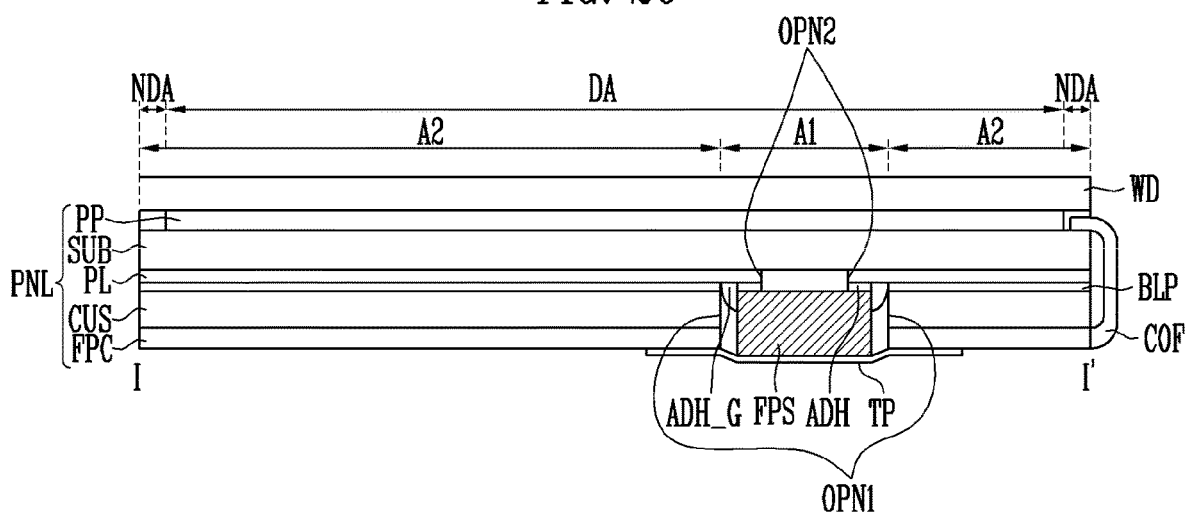

FIGS. 2B and 2C are cross-sectional views taken along line I-I' of FIG. 1 for illustrating another exemplary embodiment of an adhesive layer of FIG. 2A.

Figure 3A:
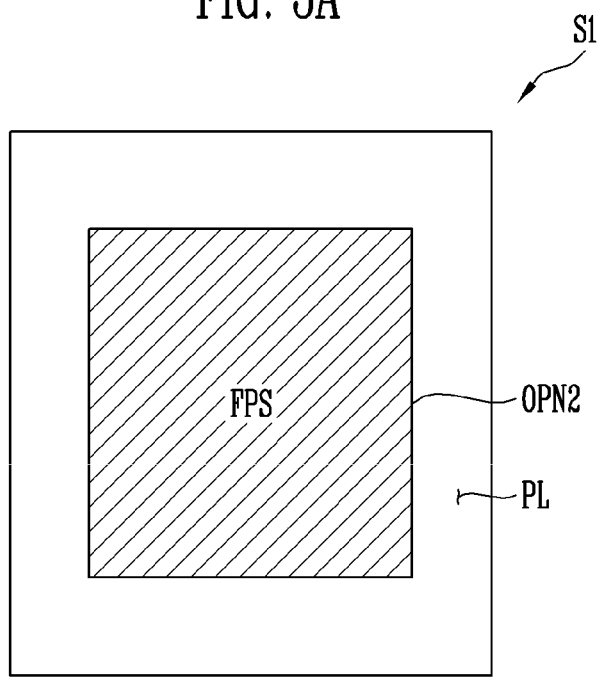
Figure 3B:
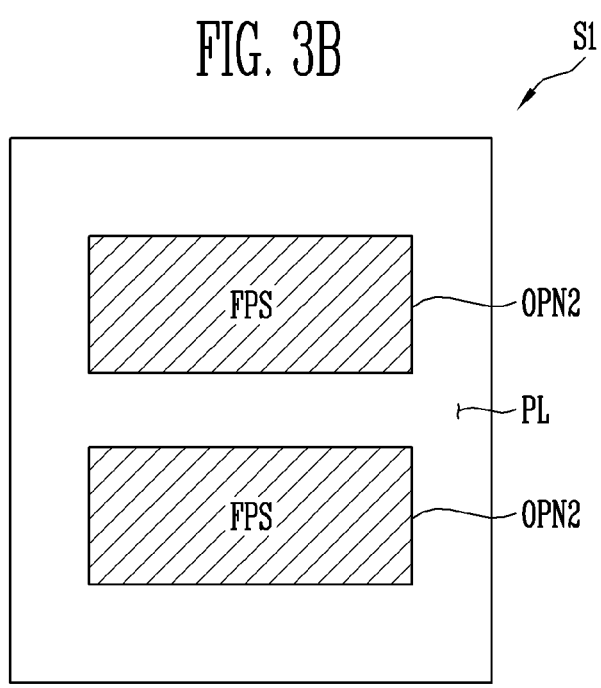

FIGS. 3A and 3B are plan views illustrating a region S1 of FIG. 2A.

Figure 4:
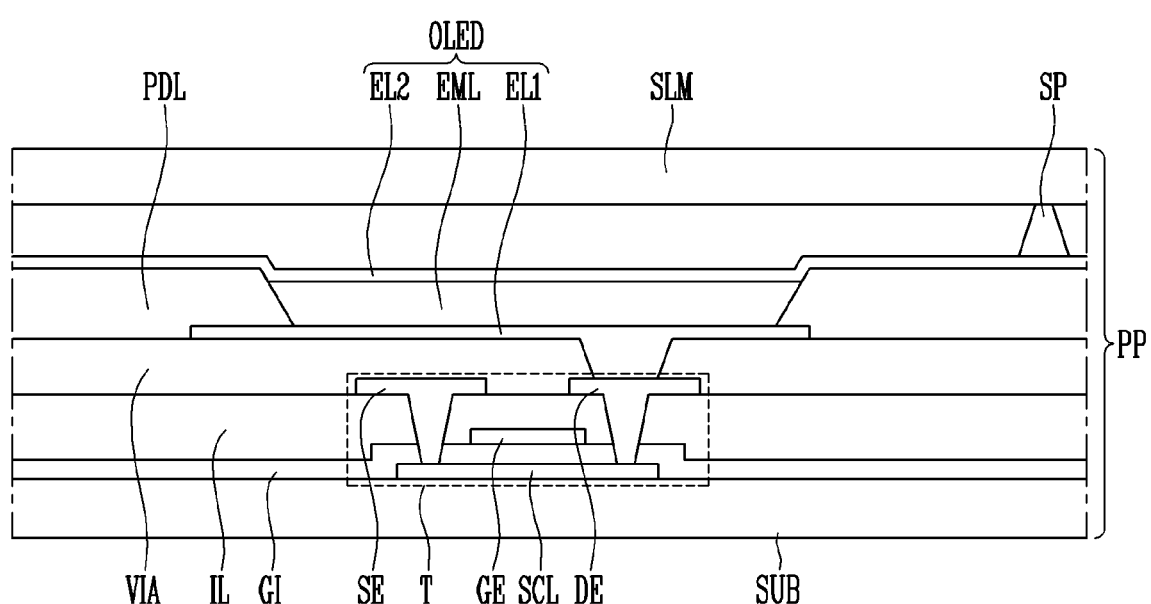

FIG. 4 is a cross-sectional view illustrating a display unit of the display device.

Figure 5:
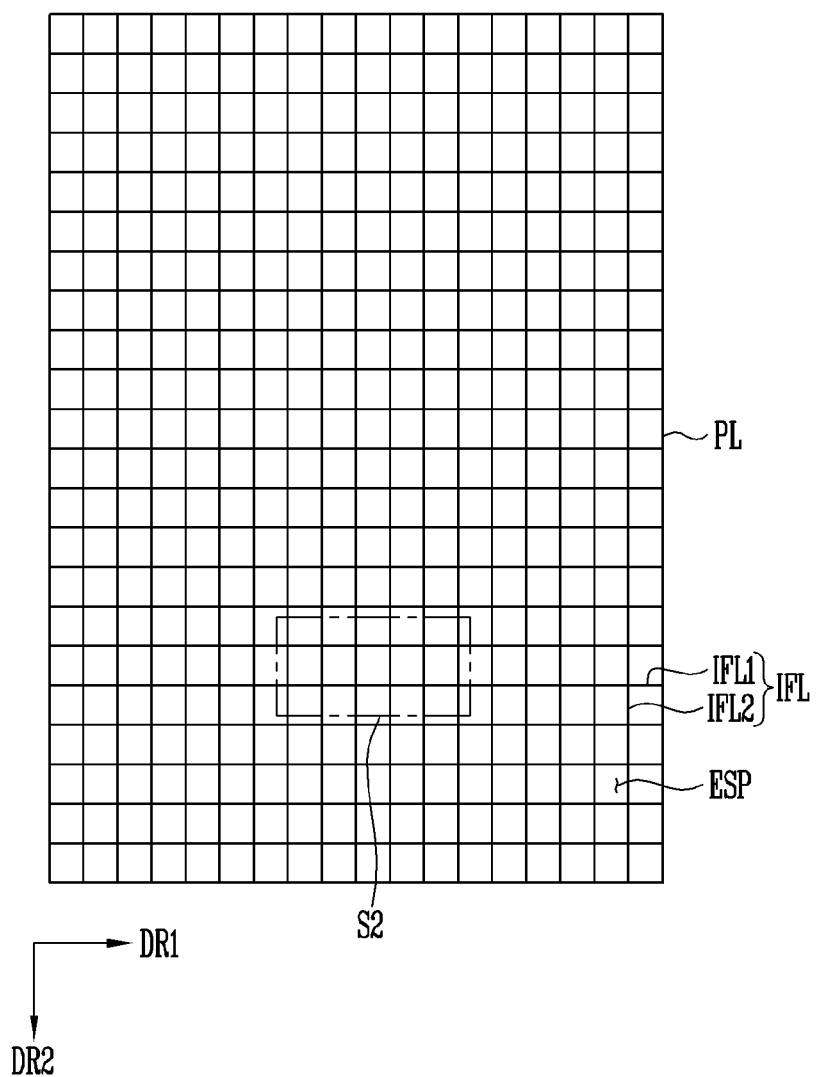

FIG. 5 is a plane view illustrating another exemplary embodiment of a protecting layer of FIG. 2A.

Figure 6:
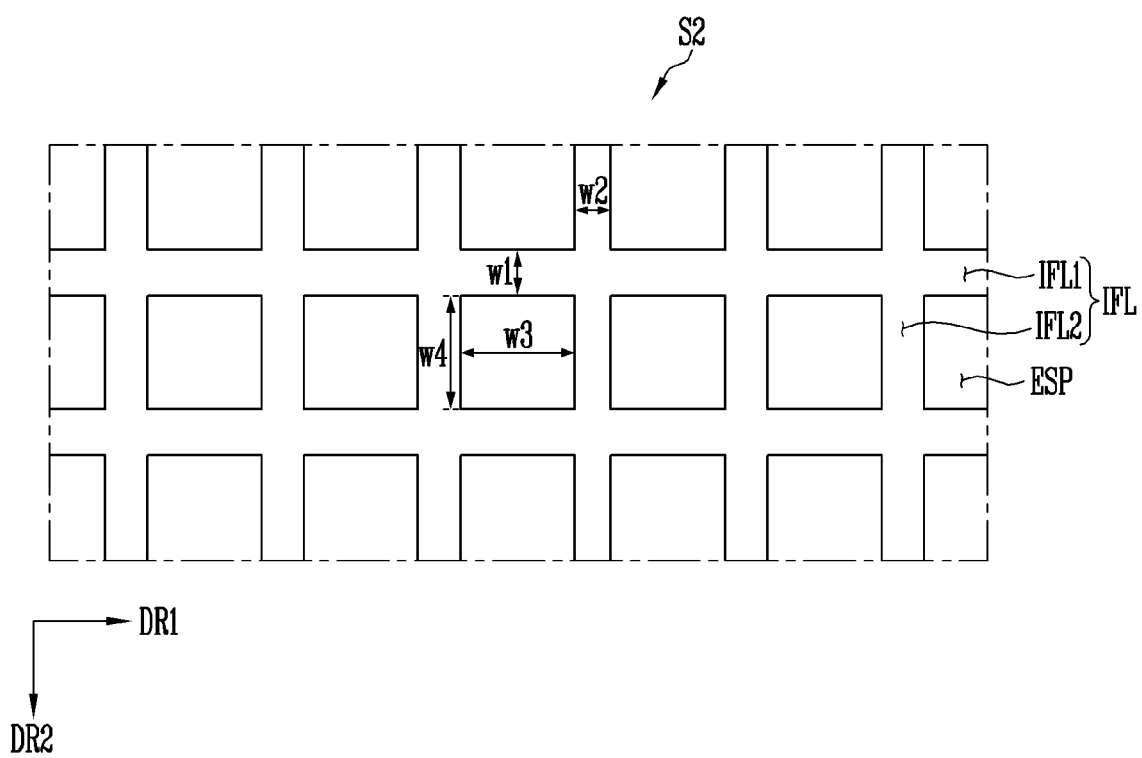

FIG. 6 is an enlarged plan view of region S2 of FIG. 5.

Figure 7:
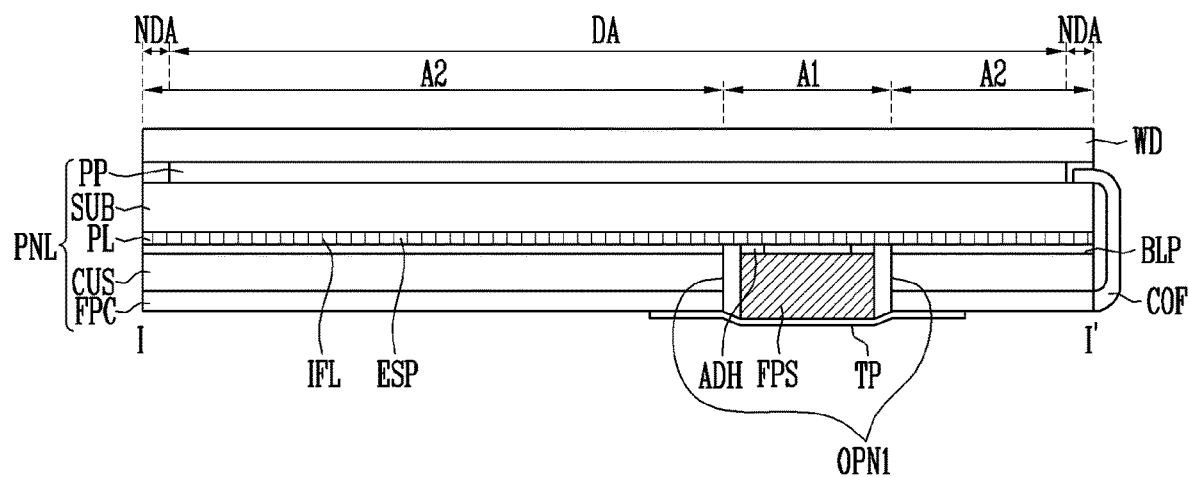

FIG. 7 is a cross-sectional view taken along line I-I' of FIG. 1 for illustrating a display device having a protecting layer of FIG. 5.

Figure 8:
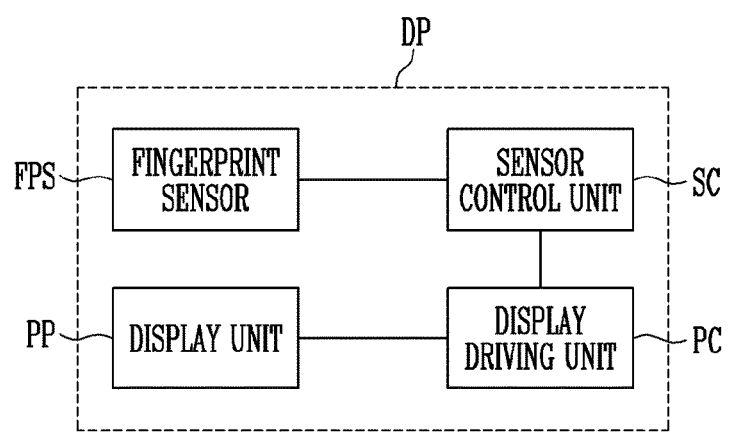

FIG. 8 is a block diagram illustrating a display device according to an exemplary embodiment of the present disclosure.

DETAILED DESCRIPTION

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a plan view illustrating a display device according to an exemplary embodiment of the present disclosure. FIG. 2A is a cross-sectional view taken along line I-I' of FIG. 1. FIGS. 2B and 2C are cross-sectional views taken along line I-I' of FIG. 1 for illustrating another exemplary embodiment of an adhesive layer of FIG. 2A.

Referring to FIGS. 1, and 2A to 2C, the display device according to the exemplary embodiment of the present disclosure may include a display panel PNL.

The display panel PNL may display arbitrary visual information, for example a text, a video, a photo, a 2-dimensional or 3-dimensional image, etc, on a front surface thereof. A type of the display panel PNL is not particularly limited, and the display panel PNL may include any device which displays an image. In the following exemplary embodiment, the display panel PNL may be, for example, an organic light emitting display (OLED) panel. However, the type of the display panel PNL is not limited thereto, and other display panels may be used therefor as long as the concept of the present disclosure is satisfied.

The display panel PNL may have various shapes, for example, the display panel PNL may be in the shape of a quadrangular plate having two pairs of sides parallel to each other. When the display panel PNL has a rectangular plate shape, one pair of the sides may be longer than the other pair of the sides. In the exemplary embodiment of the present disclosure, for convenience of description, the display panel PNL is illustrated as having a rectangular shape having a pair of long sides and a pair of short sides.

However, the shape of the display panel PNL is not limited thereto, and the display panel PNL may have various shapes. For example, the display panel PNL may have a closed polygonal shape including straight sides. The display panel PNL may also have shapes such as a circle and an ellipse including curved sides. The display panel PNL may also have shapes such as a semicircle and a semi-ellipse including straight and curved sides.

The display panel PNL may include a substrate SUB provided with a display unit PP. The substrate SUB may include a display region DA and a non-display region NDA positioned at one or more sides of the display region DA. For example, the non-display region NDA may surround the display region DA.

The display region DA may have a shape corresponding to the display panel PNL. For example, the display region DA may be a closed polygonal shape including linear sides, a circle or an ellipse including curved sides, or a semicircle or a semi-ellipse including linear and curved sides like the display panel PANL. In the exemplary embodiment of the present disclosure, the display region DA may have a rectangular shape.

The display region DA may include a plurality of pixels PXL. The non-display region NDA may be provided with a driving unit (now shown) for driving the pixels PXL.

The substrate SUB of the display panel PNL may include a first area A1 for sensing a fingerprint and a second area A2 adjacent to the first area A1. In the exemplary embodiment of the present disclosure, the first area A1 may be smaller than the second area A2. The first area A1 may have a size and a shape which allow the fingerprint of a user to be recognized. According to the exemplary embodiment of the present disclosure, for convenience sake, the first area A1 is illustrated as being rectangular. However, the present disclosure is not limited thereto. The first area A1 may be circular, elliptical, semi-circular, or polygonal. The first area A1 may be surrounded by the second area A2. However, the present disclosure is not limited thereto.

In the exemplary embodiment of the present disclosure, the first area A1 may be provided only at one side of the second area A2. The first area A1 may be provided in the display region DA. The second area A2 may be provided in the display region DA and the non-display region NDA. However, the arrangement of the first area A1 and the second area A2 is not limited thereto and may vary. For example, a part of the first area A1 may be provided in the non-display region NDA, or both the first area A1 and the second area A2 may be provided only in the display region DA.

In the exemplary embodiment of the present disclosure, in order to sense the fingerprint by using light that passes through the first area A1, light transmittance of the first area A1 may be higher than light transmittance of the second area A2. In the exemplary embodiment of the present disclosure, as the light transmittance of the first area A1 is higher, sensing ability of a fingerprint sensor FPS may improve.

The display panel PNL may include the substrate SUB, the display unit PP, a protecting layer PL, the fingerprint sensor FPS, a cushion layer CUS, and a flexible printed circuit board FPC.

The substrate SUB may include the display region DA and the non-display region NDA. The substrate SUB may be formed of one of various materials such as glass and polymeric metal. The substrate SUB may be made of an insulating material such as quartz, synthetic quartz, calcium fluoride, fluorine-doped quartz, soda-lime glass, non-alkali glass, resin, etc. In addition, the substrate SUB may be made of a flexible material so as to be bendable or foldable, and may have a single-layer structure or a multi-layer structure.

The display unit PP may be disposed on a front surface of the substrate SUB, for example, on a surface where the image is displayed. In the exemplary embodiment of the present disclosure, the display unit PP may be disposed in the display region DA excluding the non-display region NDA. The display unit PP may be disposed in both the first area A1 and the second area A2.

The display unit PP may display information input by a user or information provided to the user as an image. The display unit PP may include the plurality of pixels PXL provided on the substrate SUB.

The plurality of pixels PXL may be organic light emitting diodes (OLED) including an organic layer. However, the present disclosure is not limited thereto. The plurality of pixels PXL may be formed in various forms such as liquid crystal elements, electrophoretic elements, or electrowetting elements. Each of the pixels PXL may be a minimum unit for displaying the image, and may be provided in plurality in the display region DA. Each of the pixels PXL may include an organic light emitting element that emits white light and/or colored light. Each of the pixels PXL may include a thin film transistor (TFT) (not shown) connected to a plurality of signal wiring lines (not shown) and the OLED connected to the TFT.

The cushion layer CUS may be disposed on a rear surface of the substrate SUB, for example, on a surface where an image is not displayed. The cushion layer CUS may include an elastically deformable material and absorb external impact. For example, the cushion layer CUS may include polyurethane or polyurethane foam. The cushion layer CUS may have a single-layer structure. However, the present disclosure is not limited thereto. The cushion layer CUS may have a multi-layer structure.

The cushion layer CUS may be provided on the second area A2 and may not be provided on the first area A1 on which the fingerprint sensor FPS is provided. The cushion layer CUS may include a first opening portion OPN1 corresponding to the first area A1 according to the shape of the first area A1. Accordingly, light incident on the fingerprint sensor FPS may not transmit the cushion layer CUS. The light incident on the fingerprint sensor FPS may not be distorted or refracted while passing through the cushion layer CUS. Therefore, an intensity of light incident on the fingerprint sensor FPS may be relatively increased, and sensing sensitivity of the fingerprint sensor FPS may be further improved.

The fingerprint sensor FPS may be a sensing element that recognizes the fingerprint of the user. The fingerprint sensor FPS may be provided in the first opening portion OPN1 of the cushion layer CUS at the rear surface of the substrate SUB. The fingerprint sensor FPS may be provided only in the first area A1 and not in the second area A2. While not described in the drawings, the fingerprint sensor FPS may be connected to a fingerprint sensing circuit unit (now shown) through a separate wire, a connector, or the like. The fingerprint sensing circuit unit may be mounted on the flexible printed circuit board FPC, or separately provided. The fingerprint sensing circuit unit may be electrically connected to the flexible printed circuit board FPC.

The fingerprint sensor FPS may be an optical sensor. The fingerprint sensor FPS may recognize the fingerprint of the user by sensing a difference in reflected light that varies in accordance with whether valleys of ridges of the fingerprint of the user contact the display panel PNL. The reflected light recognized by the fingerprint sensor FPS may be light emitted from the display unit PP and reflected from the user's finger. The fingerprint sensor FPS may recognize the fingerprint when the finger of the user moves while contacting the display panel PNL as well as when the finger of the user simply contacts the display panel PNL.

The protecting layer PL may be disposed between the rear surface of the substrate SUB and the cushion layer CUS. The protecting layer PL may be a barrier layer for preventing oxygen and moisture from entering the rear surface of the substrate SUB form the outside.

The protecting layer PL may include a second opening portion OPN2 exposing a part of the fingerprint sensor FPS provided in the first area A1. The second opening portion OPN2 of the protecting layer PL may correspond to the first area A1. The fingerprint sensor FPS may be exposed to the outside through the second opening portion OPN2 of the protecting layer PL. Accordingly, the intensity of the reflected light incident on the fingerprint sensor FPS may be relatively increased. Therefore, the sensing sensitivity of the fingerprint sensor FPS may be further improved.

In the exemplary embodiment of the present disclosure, the protecting layer PL may be made of a transparent insulating material having a high light transmittance to improve the sensing sensitivity of the fingerprint sensor FPS.

In the exemplary embodiment of the present disclosure, the shape of the protecting layer PL and the shape of the cushion layer CUS may not necessarily the same as each other. The first opening portion OPN1 of the cushion layer CUS may completely correspond to the first area A1. The second opening portion OPN2 of the protecting layer PL may not completely correspond to the first area A1.

A light-blocking pattern BLP may be disposed between the protecting layer PL and the cushion layer CUS. The light-blocking pattern BLP may be an adhesive layer attaching the protecting layer PL and the cushion layer CUS. The light-blocking pattern BLP may include a light blocking material such that light emitted to display the image on the display unit PP may be prevented from entering the fingerprint sensor FPS.

The flexible printed circuit board FPC may be provided under the cushion layer CUS. The flexible printed circuit board FPC may be electrically connected to the display unit PP through a chip on film COF attached to one side of the substrate SUB. The flexible printed circuit board FPC may include a pixel driving unit (not shown) for driving the display unit PP and a driving unit (not shown) for the driving the fingerprint sensor FPS. The flexible printed circuit board FPC may be provided only in the second area A2 and not in the first area A1.

The flexible printed circuit board FPC may be disposed on the front surface or the rear surface of the substrate SUB. Typically, since the substrate SUB of the display panel PNL displays an image on the front surface of the substrate SUB, the rear surface of the substrate SUB may be an area that the user may not be able to see. Therefore, in order to maximize space efficiency and hide configurations that do not need to be recognized by the user, the flexible printed circuit board FPC may be disposed on the rear surface of the substrate SUB. However, this is only one example, and depending on the need, the flexible printed circuit board FPC may be disposed on a side surface of the substrate SUB or even the chip on film COF and the flexible printed circuit board FPC may be integrated into a single body.

In the exemplary embodiment of the present disclosure, the display device including the protecting layer PL having the second opening portion OPN2 exposing the part of the fingerprint sensor FPS may be an Inventive Example, and a display device including a protecting layer covering the entire fingerprint sensor FPS may be a Comparative Example. In each of the Comparative Example and the Inventive Example, the intensity of the light incident on the fingerprint sensor FPS may be as shown in Table 1 below.

TABLE 1

| | | |
|---|---|---|
| Comparative Example | Degree of diffusion of light | 76.2 |
| | Total Transmittance | 3.66 |
| | Diffusion transmittance | 2.79 |
| | Penetration Transmittance | 0.87 |
| Inventive Example | Degree of diffusion of light | 63.7 |
| | Total Transmittance | 4.55 |
| | Diffusion Transmittance | 2.90 |
| | Penetration Transmittance | 1.65 |

The intensity data of the light for each of the Inventive Example and the Comparative Example were obtained by measuring a data five times or more for the same display device and then averaging the data. The diffusion transmittance in Table 1 may mean the transmittance of light scattered without being transmitted in a straight line. The penetration transmittance in Table 1 may mean a ratio of light transmitted in a straight line. The total transmittance in Table 1 may mean a sum of the penetration transmittance and the diffusion transmittance. The degree of diffusion of light in Table 1 may mean a value obtained by dividing the diffusion transmittance by the total transmittance and then multiplying the result 100 times.

As shown in the Table 1, in the Inventive Example where the protecting layer PL has the second opening portion OPN2 that exposes the part of the fingerprint sensor FPS, the light transmittance may be increased and the light may be less diffused. Therefore, by using the display device according to the exemplary embodiment of the present disclosure, the intensity of light incident on the fingerprint sensor FPS may be increased and the sensing sensitivity of the fingerprint sensor FPS may be improved.

In addition, in the exemplary embodiment of the present disclosure, the light transmittance of the first area A1 in which the fingerprint sensor FPS is provided may be relatively increased by the second opening portion OPN2 of the protecting layer PL and the first opening portion OPN1 of the cushion layer CUS. Therefore, the light transmittance in the first area A1 in which the fingerprint sensor FPS is provided may be higher than the light transmittance in the second area A2 in which the fingerprint sensor FPS is not provided. Accordingly, the fingerprint sensor FPS may easily sense the fingerprint of the user.

An adhesive layer ADH may be disposed between the fingerprint sensor FPS and the protecting layer PL. The adhesive layer ADH may attach the fingerprint sensor FPS and the protecting layer PL. The adhesive layer ADH may be provided only on a part of an upper surface of the fingerprint sensor FPS as shown in FIGS. 2A and 2C. Specifically, the adhesive layer ADH may not be provided on the upper surface of the fingerprint sensor FPS corresponding to the second opening portion OPN2 of the protecting layer PL. The light incident on the fingerprint sensor FPS may be sensed directly by the fingerprint sensor FPS without passing through the adhesive layer ADH. Accordingly, the sensing sensitivity of the fingerprint sensor FPS may be improved.

In some exemplary embodiments, the adhesive layer ADH may be disposed on the entire upper surface of the fingerprint sensor FPS as shown in FIG. 2B. The adhesive layer ADH may correspond to the second opening portion OPN2 of the protecting layer PL. When the adhesive layer ADH is disposed on the entire upper surface of the fingerprint sensor FPS, the adhesive layer ADH may be made of an optically transparent adhesive material. The optically transparent adhesive material may include an optically clear adhesive material (OCA) or an optically clear resin material (OCR).

In order to securely fix the fingerprint sensor FPS, an auxiliary adhesive layer ADH_G may be further disposed between the cushion layer CUS and the fingerprint sensor FPS to as shown in FIGS. 2B and 2C. In the exemplary embodiment of the present disclosure, since the auxiliary adhesive layer ADH_G is located on a side surface of the fingerprint sensor FPS, the auxiliary adhesive layer ADH_G may not affect the intensity of light incident on the fingerprint sensor FPS. In addition, the auxiliary adhesive layer ADH_G may be provided in an empty space existing between the cushion layer CUS and the fingerprint sensor FPS to stably fix the fingerprint sensor FPS. For example, the auxiliary adhesive layer ADH_G may include an adhesive such as glue.

According to the exemplary embodiment of the present disclosure, the display panel PNL may further include a light-blocking tape TP disposed on a lower surface of the fingerprint sensor FPS. The light-blocking tape TP may prevent the fingerprint sensor FPS from being visible to the user on the front surface of the display panel PNL. In addition, the light-blocking tape TP may prevent a light leakage phenomenon that light reflected from the user' finger leaks to a rear surface of the flexible printed circuit board FPC. For example, the light-blocking tape TP may include a black fixing tape.

According to the exemplary embodiment of the present disclosure, the fingerprint sensor FPS may be fixed to the flexible printed circuit board FPC by the light-blocking tape TP. The light-blocking tape TP may be attached to the rear surface of the flexible printed circuit board FPC and cover the lower surface of the fingerprint sensor FPS.

The display device according to the exemplary embodiment of the present disclosure may further include a window WD disposed on the front surface of the display panel PNL, for example, a surface on which an image is displayed.

The window WD may be a plate corresponding to the shape of the display panel PNL and may cover at least a part of the front surface of the display panel PNL. For example, when the display panel PNL is rectangular or circular, the window WD may be rectangular or circular accordingly.

The window WD may transmit the image from the display panel PNL and releases external shock and may prevent the display panel PNL from being damaged or erroneously operating due to the external shock. The external shock may mean pressure or stress that may cause defects of the display panel PNL.

The window WD may be entirely or partially flexible. For example, the window WD may have flexibility entirety, or partially corresponding to a flexible area.

FIGS. 3A and 3B are plan views illustrating a region S1 of FIG. 2A.

Referring to FIGS. 2A, 3A, and 3B, the protecting layer PL may include the second opening portion OPN2 that exposes the part of the upper surface of the fingerprint sensor FPS. When a plurality of fingerprint sensors FPS are provided, the protecting layer PL may include the second opening portion OPN2 exposing the part of the upper surface of each of the fingerprint sensors FPS.

FIG. 4 is a cross-sectional view illustrating the display unit PP of the display device.

Referring to FIGS. 1 to 4, the display unit PP may include the substrate SUB, a transistor T provided on the substrate SUB, and a light emitting element OLED provided on the transistor T.

The transistor T may include a semiconductor layer SCL disposed on the substrate SUB, a gate electrode GE disposed on the semiconductor layer SCL, and source and drain electrodes SE and DE connected to the semiconductor layer SCL.

A buffer layer (now shown) may be provided between the substrate SUB and the semiconductor layer SCL. The buffer layer may prevent an impurity from being diffused from the substrate SUB to the transistor T.

The semiconductor layer SCL may be a semiconductor pattern made of poly-silicon, amorphous silicon, oxide semiconductor, organic semiconductor, etc. In the semiconductor layer SCL, regions in contact with the source electrode SE and the drain electrode DE may be a source region and a drain region doped or implanted with impurities. A region between the source region and the drain region may be a channel region, respectively.

The gate electrode GE may be provided on the semiconductor layer SCL with a gate insulating layer GI interposed therebetween. The gate electrode GE may apply an electric field to the semiconductor layer SCL. A current may flow or may not flow in the channel region of the semiconductor layer SCL according to the electric field applied to the semiconductor layer SCL.

The gate electrode GE may include a conductive material. For example, the gate electrode GE may include at least one selected from aluminum (Al), silver (Ag), tungsten (W), copper (Cu), nickel (Ni), chrome (Cr), molybdenum (Mo), titanium (Ti), platinum (Pt), tantalum (Ta), neodymium (Nd), scandium (Sc), and an alloy thereof. The gate electrode GE may be electrically insulated from the semiconductor layer SCL by the gate insulating layer GI.

An interlayer insulating layer IL may be provided on the gate electrode GE. The interlayer insulating layer IL may have a single-layer structure or a multi-layer structure. The interlayer insulating layer IL may be an inorganic insulating layer made of an inorganic material or an organic insulating layer made of an organic material. For example, when the interlayer insulating layer IL is a single-layer of the inorganic insulating layer, the interlayer insulating layer IL may include at least one of a silicon oxide film, a silicon nitride film, and a silicon oxynitride film. When the interlayer insulating layer IL is a multi-layer of the inorganic insulating layer, the interlayer insulating layer IL may have a structure in which the silicon oxide film and the silicon nitride film are alternately laminated. When the interlayer insulating layer IL has a single-layer structure of the organic insulating layer, the interlayer insulating layer IL may include at least one of acryl, polyimide, polyamide, and benzocyclobutene. When the interlayer insulating layer IL has a multi-layer structure of the organic insulating layers, the interlayer insulating layer IL may have a stacked structure of layers including the above-described materials. In addition, the interlayer insulating layer IL may have a stacked structure including the inorganic insulating layers and the organic insulating layers which alternately laminated.

The interlayer insulating layer IL may have a minimum capacitance to minimize a parasitic capacitance that may occur between the gate electrode GE and/or the source electrode or the gate electrode GE and the drain electrode DE.

The source electrode SE and the drain electrode DE may be provided on the interlayer insulating layer IL.

The source electrode SE and the drain electrode DE may be in contact with the source region and the drain region of the semiconductor layer SCL, respectively, through contact holes sequentially passing through the interlayer insulating layer IL and the gate insulating layer GI.

A passivation layer VIA may be provided on the source electrode SE and the drain electrode DE. The passivation layer VIA may be an inorganic insulating layer made of an inorganic material or an organic insulating layer made of an organic material.

A first electrode EL1, an emitting layer EML, and a second electrode EL2 may be provided on the passivation layer VIA. The first electrode EL1, the emitting layer EML, and the second electrode EL2 may constitute the light emitting element OLED that emits light by receiving an applied signal.

One of the first and second electrodes EL1 and EL2 may be an anode electrode, and the other of the first and second electrodes EL1 and EL2 may be a cathode electrode. For example, the first electrode EL1 may be an anode electrode and the second electrode EL2 may be a cathode electrode. When the light emitting element OLED is a top-emission type organic light emitting element, the first electrode EL1 may be a reflective electrode, and the second electrode EL2 may be a transmissive electrode. In an exemplary embodiment of the present disclosure, for example, the light emitting element OLED may be a top-emission type organic light emitting element, and the first electrode EL1 may be an anode electrode.

The first electrode EL1 may be connected to the drain electrode DE through a contact hole passing through the passivation layer VIA. The first electrode EL1 may include a reflective layer (not shown) capable of reflecting light and a transparent conductive layer (not shown) disposed on the top or bottom of the reflective layer. At least one of the transparent conductive layer and the reflective layer may be connected to the drain electrode DE.

A pixel defining layer PDL may be further provided on the passivation layer VIA. The pixel defining layer PDL may have an opening through which a portion of the first electrode EL1, e.g., a top surface of the first electrode EL1 is exposed. For example, the pixel defining layer PDL may include at least one of polystyrene, polymethylmethacrylate (PMMA), polyacrylonitrile (PAN), polyamide (PA), polyimide (PI), polyarylether (PAE), heterocyclic polymer, parylene, epoxy, benzocyclobutene (BCB), siloxane based resin, and silane based resin.

The emitting layer EML may be provided on the exposed surface of the first electrode EL1. The emitting layer EML may include a low-molecular or high-molecular material. In an exemplary embodiment of the present disclosure, the low-molecular material may include copper phthalocyanine (CuPc), N,N'-Di(naphthalene-1-yl)-N,N'-diphenyl-benzidine (NPB), tris-8-hydroxyquinoline aluminum ($Alq_3$), and the like. The high-molecular material may include poly(3,4-ethylenedioxythiophene) (PEDOT)-, poly(phenylene-vinylene) (PPV)-, poly(fluorine)-based materials.

The emitting layer EML may be provided as a single layer, but may be provided as multiple layers including various functions. When the emitting layer EML is provided as a multi-layer, the emitting layer EML may have a structure in which a hole injection layer, a hole transport layer, an emission layer, an electron transport layer, an electron injection layer, and the like are stacked in a single or complex structure. The present disclosure is not necessarily limited thereto, and the emitting layer EML may have various structures. In addition, at least a portion of the emitting layer EML may be integrally formed throughout a plurality of first electrodes ELL or be individually provided to correspond to each of the plurality of first electrodes EL1. The color of light generated in the emitting layer EML may be one of red, green, blue, and white, but the present disclosure is not limited thereto. For example, the color of light generated in a light generation layer of the emitting layer EML may be one of magenta, cyan, and yellow.

The second electrode EL2 may be provided on the emitting layer EML. The second electrode EL2 may be a semi-transmissive reflective layer. For example, the second electrode EL2 may be a thin metal layer having a thickness which allows light emitted through the emitting layer EML to be transmitted. The second electrode EL2 may transmit a portion of the light emitted from the emitting layer EML therethrough, and may reflect the rest of the light emitted from the emitting layer EML.

A spacer SP may be provided on the second electrode EL2. The spacer SP may maintain a constant gap between the display unit PP having the second electrode EL2 and a sealing member SLM.

The sealing member SLM may be an encapsulating substrate facing the substrate SUB and being attached to the substrate SUB to seal the display region DA of the substrate SUB.

FIG. 5 is a plane view illustrating an exemplary embodiment of the protecting layer of FIG. 2A. FIG. 6 is an enlarged plan view of a region S2 of FIG. 5. FIG. 7 is cross-sectional view taken along line I-I' of FIG. 1 for illustrating the display device having the protecting layer of FIG. 5.

In FIGS. 5 to 7, in order to avoid redundant explanations, differences from the above-described exemplary embodiments will be mainly described. The parts not specifically described in an exemplary embodiment of the present disclosure are as described according to the above-described exemplary embodiments, and the same numerals denote the same elements, and similar numerals denote similar elements.

Referring to FIGS. 1, 2A, and 5 to 7, the display device according to the exemplary embodiment of the present disclosure may include the display panel PNL and the window WD.

The display panel PNL may include the substrate SUB, the display unit PP, the protecting layer PP, the fingerprint sensor FPS, the cushion layer CUS, and the flexible printed circuit board FPC.

The protecting layer PL may be disposed between a rear surface of the substrate SUB and the cushion layer CUS. The protecting layer PL may be a barrier layer for preventing oxygen and moisture from entering the rear surface of the substrate SUB form the outside.

In the exemplary embodiment of the present disclosure, the protecting layer PL may include a plurality of insulating fine lines IFL. For example, the insulating fine lines IFL may include a plurality of first insulating fine lines IFL1 extending in a first direction DR1 and a plurality of second insulating fine lines IFL2 extending in a second direction DR2 intersecting the first direction DR1. The first insulating fine liens IFL1 and the second insulating fine lines IFL2 may cause the protecting layer PL to have a mesh structure. The protecting layer PL having the mesh structure may include a plurality of empty spaces ESP, for example, regions formed when the first insulating fine lines IFL1 and the second insulating fine lines IFL2 intersect each other.

In the exemplary embodiment of the present disclosure, each of the first insulating fine lines IFL1 may have a first width w1 along the second direction DR2. The first width w1 may be about 100 μm to 475 μm. Each of the second insulating fine lines IFL2 may have a second width w2 along the first direction DR1. The second width w2 may be about 100 μm to 475 μm. The first width w1 and the second width w2 may be equal to each other. However, the present disclosure is not limited thereto. For example, the first width w1 and the second width w2 may be different from each other.

One of the empty spaces ESP may be created when two adjacent first insulating fine lines IFL1 along the second direction DR2 and two adjacent second insulating fine lines IFL2 along the first direction DR1 cross each other. One empty space ESP may have a third width w3 along the first direction DR1 and a fourth width w4 along the second direction DR2.

One empty space ESP may have a square shape in which the third width w3 and the fourth width w4 are equal to each other. However, the present disclosure is not limited thereto. The third width w3 and the fourth width w4 may be about 150 μm to 200 μm, respectively.

As described above, when the protecting layer PL having the mesh structure is provided on the rear surface of the substrate SUB, the insulating fine lines IFL and the empty spaces ESP may correspond to the first and second areas A1 and A2 of the display panel PNL.

When the insulating fine lines IFL of the protecting layer PL correspond to the first area A1, a phenomenon that the fingerprint sensor FPS corresponding to the first area A1 is viewed by a user may be reduced. In addition, when the empty spaces ESP of the protecting layer PL correspond to the first area A1, the fingerprint sensor FPS may be partially exposed due to the empty spaces ESL. Accordingly, the intensity of reflected light incident on the fingerprint sensor FPS may increase, so that the sensing sensitivity of the fingerprint sensor FPS may be improved.

FIG. 8 is a block diagram illustrating a display device DP according to an exemplary embodiment of the present disclosure.

Referring to FIG. 8, the display device DP according to the exemplary embodiment of the present disclosure may further include a sensor control unit SC and a display driving unit PC.

The sensor control unit SC may control the operation of the fingerprint sensor FPS, and sense a variation of light in the fingerprint sensor FPS, thereby sensing the fingerprint of the user.

The display driving unit PC may provide an image driving signal to the display panel PNL, thereby controlling an image display operation of the display panel PNL. The display driving unit PC may generate the image driving signal by using image data and a control signal provided from the outside. For example, the display driving unit PC may receive the image data and the control signal from a host (not shown), and the control signal may have a vertical synchronization signal, a horizontal synchronization signal, a main clock signal, and the like. In addition, the image driving signal may have a scan signal and a data signal generated by using the image data.

The sensor control unit SC and the display driving unit PC may be integrated into a single configuration. For example, the sensor control unit SC and the display driving unit PC may be disposed in a single integrated circuit (IC).

According to an embodiment of the present disclosure, a display device including a fingerprint sensor having improved fingerprint sensing ability may be provided.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
   a substrate comprising a display region and a non-display region disposed at one side of the display region;
   a display unit disposed on a front surface of the substrate, the display unit comprising a plurality of pixels configured to display an image;
   a cushion layer disposed on a rear surface of the substrate, the cushion layer comprising a first opening portion, wherein the first opening portion is disposed to correspond to the display region;
   a fingerprint sensor provided in the first opening portion of the cushion layer, the fingerprint sensor being configured to sense a fingerprint of a user; and
   a tape disposed on a rear surface of the fingerprint sensor, the tape covering at least part of the cushion layer and the rear surface of the fingerprint sensor.

2. The display device of claim 1, further comprising a protecting layer disposed between the substrate and the cushion layer.

3. The display device of claim 2, further comprising an adhesive layer disposed between the fingerprint sensor and the protecting layer.

4. The display device of claim 1, further comprising an adhesive layer disposed between the fingerprint sensor and the substrate.

5. A display device comprising:
   a substrate comprising a display region and a non-display region disposed at one side of the display region;
   a display unit disposed on a front surface of the substrate, the display unit comprising a plurality of pixels configured to display an image;
   a cushion layer disposed on a rear surface of the substrate, the cushion layer comprising a first opening portion, wherein the first opening portion is disposed to correspond to the display region;
   a fingerprint sensor provided in the first opening portion of the cushion layer, the fingerprint sensor being configured to sense a fingerprint of a user; and
   a protecting layer disposed between the substrate and the cushion layer,
   wherein:
   the protecting layer comprises a second opening portion; and
   the second opening portion is defined to expose at least part of a front surface of the fingerprint sensor.

6. The display device of claim 5, wherein a size of the first opening portion is larger than a size of the second opening portion.

7. The display device of claim 5, further comprising an adhesive layer disposed between the fingerprint sensor and the protecting layer.

8. The display device of claim 5, further comprising an adhesive layer disposed between the fingerprint sensor and the substrate.

9. The display device of claim 5, further comprising a light blocking layer disposed on a rear surface of the fingerprint sensor, the light blocking layer covering at least part of the cushion layer and the rear surface of the fingerprint sensor.

* * * * *